STABILIZED VARIABLE OSCILLATOR SYSTEM

Filed June 27, 1956 3 Sheets-Sheet 1

INVENTOR.
SAMUEL L. BROADHEAD, JR.
BY Moody and Goldman
ATTORNEYS

STABILIZED VARIABLE OSCILLATOR SYSTEM

Filed June 27, 1956 3 Sheets-Sheet 2

INVENTOR.
SAMUEL L. BROADHEAD, JR.
BY Moody and Goldman
ATTORNEYS

INVENTOR.
SAMUEL L. BROADHEAD, JR.
BY
Moody and Goldman
ATTORNEYS

United States Patent Office 2,810,832

Patented Oct. 22, 1957

2,810,832

STABILIZED VARIABLE OSCILLATOR SYSTEM

Samuel L. Broadhead, Jr., Cedar Rapids, Iowa, assignor to Collins Radio Company, Cedar Rapids, Iowa, a corporation of Iowa

Application June 27, 1956, Serial No. 594,281

19 Claims. (Cl. 250—36)

This invention relates to means for continuously stabilizing the output of a variable oscillator by means of harmonics from a crystal-controlled source over a frequency range which may be very large.

There are prior systems which provide continuous surveillance of a variable oscillator's output frequency by a more stable frequency source, such as a crystal-controlled source. A difficulty with such prior stabilized oscillators is that they require precision-variable oscillators. Accordingly, such prior stabilized oscillators require variable oscillators that can be directly tuned in an unstabilized manner with a precision that must increase as the increments between the output frequencies of the system decreases. As a result, precision oscillators are required by such conventional systems, and they are often very expensive.

For example, one type of conventional stabilized variable oscillator can provide output frequencies over a range between one and two megacycles-per-second with one kilocycle increments. It must have a variable oscillator that is able to tune within 500 cycles-per-second of the desired frequency. In this example, the variable oscillator must be tunable, before stabilization, with an error of not greater than about 0.02 percent. Such a conventional system includes a harmonic generator that provides crystal-controlled harmonics spaced by one kilocycle increments.

It is characteristic of this type of conventional stabilized system to latch the frequency of the variable oscillator with the nearest harmonic selected by initial direct tuning of the oscillator. Thus, the directly-tuned oscillator frequency must be closer to a required harmonic than to any other harmonic before the desired harmonic can be selected for purposes of comparison with the variable oscillator frequency.

The invention stabilizes a variable oscillator without it being a precision oscillator (according to present standards), regardless of the number of output frequencies provided by the invention when its output is phase-locked with the reference-frequency source. For example, the invention can provide an output-frequency range of one to two megacycles in one kilocycle steps while using a variable oscillator with a direct tuning error of plus or minus about two percent. In other words, the invention permits the use of a variable oscillator that is about 100 times less accurate than in the above described conventional system for the same type of stabilized output.

The invention can also provide an infinitely-variable stabilized frequency output.

However, when the invention provides an incremental type of output, it can be stabilized to a higher degree than when its output is variable; and in the former case, it can stabilize its output frequency to higher order than the stability of a crystal-source reference frequency.

Another important advantage of the invention is that it readily permits direct-decade tuning. Some types of conventional stabilized variable oscillator systems are not directly adaptable for decade tuning.

The invention includes a plurality of frequency-comparing sections. Each section uses a different numerical order of frequencies derived from the stabilized source, which may be a crystal oscillator.

A gating arrangement is provided between the different frequency-comparing sections, wherein the gating sequence is dependent upon the numerical order of the respective sections. The highest-order section operates first and is followed in operation by the other sections in a sequence according to their respectively decreasing orders.

Each frequency-comparing section includes a frequency stabilized input source, which is derived either directly from a stable fixed-frequency oscillator, or from one of its harmonics, or indirectly from one of the submultiples of the oscillator frequency. Each section further includes a spectrum generator that receives the output of its frequency source, a tunable circuit connected to the spectrum generator to select a required harmonic, a mixer having one input connected to the tunable circuit, a second-tuned circuit receiving the output of the mixer, and a frequency discriminator receiving the output of the last-tuned circuit.

The output of the variable oscillator provides the other input to the mixer in the highest-order section. The other inputs to the mixer in the second and each lower-order section are provided respectively by the first-order difference output of the mixer in the adjacent higher-order section.

Furthermore, the second and lower order frequency-comparing sections each include gate circuit means connected serially with the output of its mixer. The gate circuit means is controlled by the outputs of the discriminators of the higher-order sections.

The discriminator in each section provides a D. C. output which tunes the variable oscillator through a servo-mechanism or regular means to stabilize the frequency of the variable oscillator.

The invention can be tuned, for example, by a plurality of knobs, or other tuning-control means, with each tuning-control means having a different numerical order of frequency indication. Thus, the first-control knob (or tuning means) directly tunes the variable oscillator and the tunable circuit of the highest-order frequency-comparing section. The second control knob (or tuning-control means) then tunes the discriminator in the highest-order section and the tunable circuit of the second-highest order section. A third knob (or tuning-control means) tunes the discriminator in the second-order frequency-comparing section. If there are any further sections, there will be respective lower-order tuning-control means; wherein each tuning-control means tunes the tunable circuit in the respective-further section and the discriminator of the immediately preceding section.

Further objects, features, and advantages of this invention will be apparent to a person skilled in the art upon further study of the specification and drawings in which, Figure 1 illustrates the invention generically;

Figure 1:
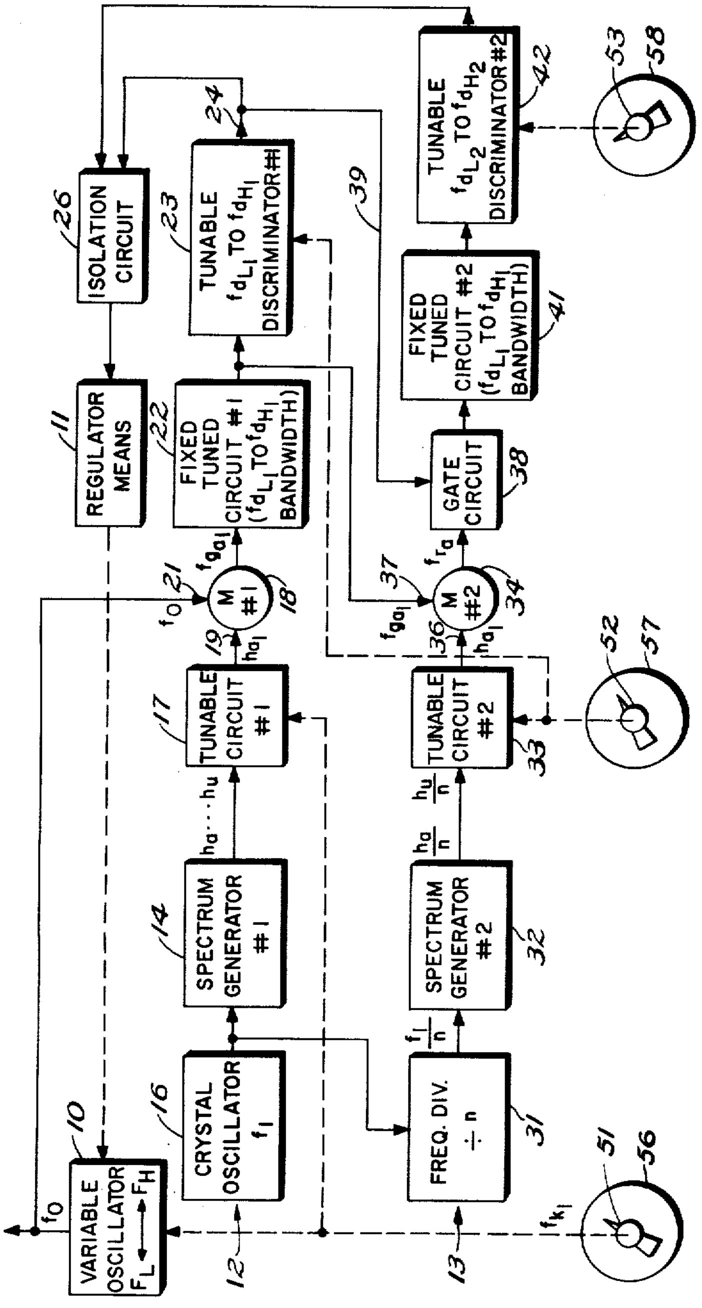

Now referring to the invention in more detail, Figure 1 shows a basic form which includes a variable oscillator 10, that is continuously tunable from a lower boundary frequency $f_L$ to an upper boundary frequency $f_H$.

Variable oscillator 10 may be tuned in any one of many different ways, such as by a mechanically-positioned rotary capacitor, or by a mechanically-positioned permeable slug; or, on the other hand, variable oscillator 10 may be electrically tuned by a reactance tube, a saturable reactor or a D. C. variable capacitor. Thus, the type of tuning provided for variable oscillator 10 is not important to this invention.

Variable oscillator 10 also includes a frequency-correcting device (not shown), which is controlled by a servomechanism or regulator means 11. The frequency correcting device may be any controllable type of frequency tuning element such as any of those named above that will provide a fine tuning adjustment for variable oscillator 10. For example, the frequency corrector may be a controllable reactor type of inductance, wherein a D. C. output from regulator means 11 controls the saturation state of the reactor to thereby finely adjust the frequency of variable oscillator 10.

The invention utilizes a plurality of frequency-comparing sections, wherein Figure 1 illustrates the minimum number of two, which are sections 12 and 13. Each section includes a frequency generator, a tuned circuit, a mixer, an amplifier, and a discriminator. In addition, second section 13 includes a gate circuit.

Thus, highest order frequency-comparing section 12 includes a spectrum generator 14, which receives an input from a frequency generator 16 that in Figure 1 is a crystal oscillator providing an output frequency $f_1$. Spectrum generator 14 provides a spray of harmonics $h_a \ldots h_u$ spaced by increments equal to frequency $f_1$.

A first tunable circuit 17 in highest-order section 12, receives the output of harmonic generator 14 and passes a selected one of its harmonics, while providing substantial attenuation to other harmonics.

A mixer 18 in section 12 has one input 19 connected to the output of first tunable circuit 17 to receive the selected harmonic and has its other input 21 connected to the output of variable oscillator 10 to receive variable-oscillator frequency $f_0$.

A fixed tuned circuit 22 in section 12 is connected to the output of mixer 18, and a first-tunable discriminator 23 has its input connected to the output of tuned circuit 22. First discriminator 23 has a tunable range from a lower boundary frequency $$f_{d_{L_1}}$$

to an upper boundary frequency $$f_{d_{H_1}}$$

The output 24 of discriminator 23 is connected through an isolation circuit 26 to regulator means 11.

Second-order frequency comparing section 13 includes a second stable frequency source 31 which is a frequency divider that divides the output frequency $f_1$ of oscillator 16 by an integer $n$ to provide an output frequency $f_1/n$.

A second spectrum generator 32 is connected to source 16. As a result, spectrum generator 32 will provide a spray of harmonics which may be defined by the series $h_a/n \ldots h_u/n$, which are spaced by frequency increments of $f_1/n$. Consequently, the spectrum provided by second generator 32 can have the same basic stability as first generator 14. If a regenerative frequency divider is used, source 31 will have greater stability than crystal oscillator 16 by the order of division.

A tunable circuit 33 in second section 13 is connected to the output of second spectrum generator 32 and passes a selected one of its harmonics. A second mixer 34 has one of its inputs 36 connected to the output of tunable circuit 33 to receive the selected harmonic. The other input 37 of mixer 34 is connected to the output of fixed tuned amplifier 22 in the highest-order frequency section 12.

A gate circuit 38 in section 13 is serially connected to the output of second mixer 34. Gate circuit 38 either passes or blocks the output of second mixer 34. A lead 39 connects the control elements in gate circuit 38 to the output of first discriminator 23 in section 12, which controls the opening and closing function of gate circuit 38. Gate circuit 38 has its output blocked when lead 39 receives a D. C. output of either polarity from first discriminator 23 that is sufficient to actuate regulator means 11.

Thus, when the D. C. output of first discriminator 23 is below a required threshold level, gate circuit 38 is opened and permits the output of second mixer 34 to pass to a second fixed-tuned circuit 41, which is connected to the output of gate circuit 38. On the other hand, when the D. C. output of first discriminator 23 is above the threshold level, gate circuit 38 is closed and does not permit any mixer output to pass to fixed-tuned circuit 41.

A second tunable discriminator 42 has its input connected to the output of fixed-tuned circuit 41. The direct-current output of second discriminator 42 is connected through isolation circuit 26 to regulator means 11 to control variable oscillator 10, when it is not being controlled by the output of first discriminator 23.

Isolation circuit 26 provides a low impedance from either first discriminator 23 or second discriminator 42 to regulator means 11; but isolation circuit 11 provides a very high impedance between the respective outputs of discriminators 23 and 42. Accordingly, isolation circuit 26 prevents a direct-current feedback path from the output of second discriminator 42 back to gate circuit 38. Such D. C. feedback would adversely affect the operation of gate circuit 38.

A first control knob 51 simultaneously tunes variable oscillator 10 and first tunable circuit 17. A second control knob 52 simultaneously tunes second tunable circuit 33 and first discriminator 23. And a third knob 53 tunes second discriminator 42.

Input frequency $f_1$ is chosen to be greater than any tuning error variation that may occur in output frequency $f_0$ of variable oscillator 10 due to manual tuning by means of first knob 51. Thus, the frequency spacing between adjacent harmonics in the output of spectrum generator 14 is greater than any tuning error variation caused by direct tuning with knob 51.

Accordingly, tuning by knob 51 is capable of selecting a single desired harmonic from the output of generator 14 in preference to all of its other harmonics, since tuning by knob 51 is capable of placing output frequency $f_0$ closer to the desired harmonic than to any other of the harmonics.

Where tuning by knob 51 is not very accurate, the harmonics from first spectrum generator 14 will be relatively widely spaced; and, therefore, frequency $f_1$ of generator 16 will be relatively large. For example, if variable oscillator 10 can be tuned by knob 51 to within +50 kilocycles of the frequency indicated by a dial 56 that is associated with knob 51, frequency $f_1$ must then be at least 100 kilocycles-per-second. On the other hand, if variable oscillator 10 can be tuned by knob 51 only to within +250 kilocycles of its indicated frequency, then, frequency $f_1$ of first generator 16 should be at least 500 kilocycles-per-second. Consequently, the input frequency to first spectrum generator 14 should be at least twice the magnitude of the maximum tuning deviation from the indicated frequency that occurs in tuning variable oscillator 10 directly by first knob 51.

A setting of knob 51, therefore, roughly adjusts the frequency of variable oscillator 10.

However, the setting of knob 51 also adjusts first tuned circuit 17 to select a given harmonic from the set, $h_a \ldots h_u$, that corresponds to the setting of variable oscillator 10. The selected harmonic is chosen so that it heterodynes variable oscillator frequency $f_0$ in mixer 18 to a lower frequency which will fall within the tunable range of first discriminator 23, which is between the boundary frequencies $$f_{d_{L_1}} \text{ and } f_{d_{H_1}}$$

that are approximately equal to any two adjacent harmonics from generator 14 and therefore have a difference equal to $f_1$.

Tuned circuit 17 may select either of two harmonics $h_{a_1}$ or $h_{b_1}$ from the output of first spectrum generator 14 to heterodyne oscillator frequency $f_0$ into the range of first discriminator 23. Harmonics $h_{a_1}$ and $h_{b_1}$ may be defined as follows:

$$h_{a_1}=f_{k_1}-f_{d_{L_1}} \quad (1)$$

and $$h_{b_1}=f_{k_1}+f_{d_{h_1}} \quad (2)$$

where $f_{k_1}$ is the frequency indicated by the setting of highest order knob 51, $$f_{d_{L_1}}$$

is the lower-boundary frequency of first discriminator 23 and $$f_{d_{H_1}}$$

is the upper boundary frequency of first discriminator.

Harmonic $h_{a_1}$ is below the initial output frequency $f_{0_1}$ of variable oscillator 10, while harmonic $h_{b_1}$ is above frequency $f_{0_1}$.

As stated above, tuning boundary frequencies $$f_{d_{L_1}} \text{ and } f_{d_{H_1}}$$

of first discriminator 23 will be approximately equal to any two adjacent harmonics provided by first spectrum generator 14. The discriminator tunable range may extend beyond these limits but should not be less than the amount between the boundary frequencies. Generally, it is preferable to make the boundary frequencies as low as possible, since the tuning error of a discriminator is a function of the absolute value of its tuned frequency. Accordingly, the tunable range of discriminator 23 will generally be chosen to be between the first and second harmonics or between the second and third harmonics of spectrum generator 14.

However, the discriminator must be capable of providing a D. C. output of the proper polarity when its input frequency is considerably different than its tuned frequency. And further, the discriminator should be able to respond with a proper polarity D. C. output when its input frequency is outside its tunable boundaries by as much as the maximum possible absolute frequency error of variable oscillator 10.

Only one of the harmonics $h_{a_1}$ or $h_{b_1}$ may be chosen and either will heterodyne variable oscillator frequency $f_0$ into the range of discriminator 23. Thus, when harmonic $h_{a_1}$ is used, the following relationship holds:

$$f_{s_{a_1}}=f_{0_1}-h_{a_1}=f_{d_{L_1}}+\Delta f_1 \quad (3)$$

where $$f_{s_{a_1}}$$

is the first-order difference output frequency of mixer 18 when harmonic $h_{a_1}$ is provided as an input, $f_{0_1}$ is the initial output frequency of variable oscillator 10 obtained by a setting of highest-order tuning knob 51, and $\Delta f_1$ is the initial error in the initial oscillator frequency $f_{0_1}$, which is the difference between initial frequency $f_{0_1}$ and frequency $f_{k_1}$ indicated by knob 51.

On the other hand, if harmonic $h_{b_1}$ is selected, the following expression holds:

$$f_{s_{b_1}}=h_{b_1}-f_{0_1}=f_{d_{h_1}}-\Delta f_1 \quad (4)$$

where $$f_{s_{b_1}}$$

is the first-order difference output frequency of first mixer 18 when harmonic $h_{b_1}$ is selected.

It is noted from the expression (3) that a positive frequency error $(+\Delta f_1)$ in direct tuning by first knob 51 causes an increase in frequency $$f_{s_{a_1}}$$

provided to discriminator 23. On the other hand, it is noted from expression (4) that a positive frequency error $(+\Delta f_1)$ in direct tuning by knob 51 causes a decrease in the frequency $$f_{s_{b_1}}$$

provided to discriminator 23. Thus, a reversal in the tuning direction for the discriminator occurs when harmonic $h_{b_1}$ is selected rather than $h_{a_1}$.

Also, the range of harmonics from spectrum generator 14 utilized by the system is different when harmonic $h_{a_1}$ is selected rather than harmonic $h_{b_1}$.

If harmonic $h_{a_1}$ is used, spectrum 14 should have a harmonic spray that falls within a range from frequency $$(f_L-f_{d_{L_1}})$$

through frequency $$(f_H-f_{d_{L_1}})$$

On the other hand, when harmonic $h_{b_1}$ is used, spectrum generator 14 should then provide harmonics over a range from frequency $$(f_L+f_{d_{H_1}})$$

through frequency $$(f_H+f_{d_{H_1}})$$

It is generally desirable to use harmonic $h_{a_1}$ in preference to harmonic $h_{b_1}$. Therefore, in the following frequency-comparing sections of the invention, it will be presumed that harmonic $h_{a_1}$ is the selected harmonic.

Fixed tuned circuit 22 has a bandwidth which is at least as wide as the tunable range of first discriminator 23. Tuned circuit 22 passes the first-order difference frequency of the two inputs to first mixer 18. Since each of the inputs to first mixer 18 is relatively large, the input frequencies, and the first-order summed frequency from mixer 18 will be widely spaced from its first-order difference frequency. Accordingly, a broad band-pass provided for tuned circuit 22 generally will be sufficient to provide substantial attenuation for the undesired mixer outputs. If amplification is needed tuned circuit 22 may be made a tuned amplifier.

First tunable discriminator 23 is tuned by second-order knob 52. Due to the fact that any absolute frequency within the tunable range of first discriminator 23 is only a fraction of any absolute frequency within the tunable range of variable oscillator 10, the maximum error in tuning first discriminator 23 will be proportionately less than the maximum error in tuning variable oscillator 10. This is based upon the principle that the tuning error of a tuned circuit is generally a percentage function of its absolute frequency. For example, a one percent tuning error at an absolute frequency of 100 kilocycles-per-second is one kilocycle; while a one percent error at an absolute frequency of 1 megacycle is 10 kilocycles-per-second.

Consequently, first discriminator 23 will be tuned to a frequency that has an absolute error of only a fraction of the possible absolute error in the output frequency of variable oscillation 10 obtained by direct tuning with knob 51.

First discriminator 23 will provide a D. C. output which will operate regulator means 11 to finely tune variable oscillator 10 until heterodyned frequency $$f_{s_{a_1}}$$

aligns with the tuned frequency of first discriminator 23, within its range of error. Hence, oscillator frequency $f_0$ is brought into alignment with the setting of discriminator 23, since frequency $f_0$ is related to frequency $$f_{s_{a_1}}$$

by the amount of the chosen harmonic $h_{a_1}$, which has the stability of crystal oscillator 16. Consequently, the setting of both knobs 51 and 52 have greatly improved the accuracy of output frequency $f_0$ over that obtained by direct adjustment of variable oscillator 10.

Thus, it is seen how highest-order frequency-comparing section 12 stabilizes the output frequency of master oscillator 10 to a first order of accuracy. The system of section 12 per se is known, and is utilized as an element of the present invention.

This invention teaches how the order of stability for variable oscillator 10 may be increased further to any amount desired without requiring any further direct tuning accuracy for variable oscillator 10.

This invention provides one or more lower-order frequency-comparing sections with a special gate arrangement, such as second-order frequency comparing section 13 in Figure 1. Section 13 utilizes a frequency divider 31 as its frequency standard. Divider 31 is connected to the output of oscillator 16 and divides it by submultiple $n$ to provide an output frequency $f_1/n$.

Second spectrum generator 32 is connected to divider 31 to receive frequency $f_1/n$. Therefore, spectrum generator 32 provides a spray of harmonics spaced by $f_1/n$ which is smaller spacing than provided between the harmonics from first generator 14. The spacing of harmonics from second generator 31 may be made as small as the selectivity of second tunable circuit 33 will permit.

Second tunable circuit 33 is required to select one of the harmonics from second spectrum generator 32 and to substantially attenuate the other harmonics.

Second mixer 34 has one input connected to the output of fixed-tuned circuit 22 in highest-order section 12. Therefore, mixer 34 in second section 13 receives as one input the heterodyned output frequency from mixer 18 in first section 12.

As occurred with first tunable circuit 17, second tunable circuit 33 has the option of selecting one of two harmonics, $h_{a_2}$ or $h_{b_2}$, either of which may be used to operate second-order frequency comparing section 13. Each of these harmonics are determined in a manner similar to determining the output harmonic $h_{a_1}$ or $h_{b_1}$ from first tunable circuit 17. Harmonics $h_{a_2}$ and $h_{b_2}$ may be defined by the following expressions:

$$h_{a_2}=f_{k_2}-f_{d_{L_2}} \qquad (5)$$

$$h_{b_2}=f_{k_2}-f_{d_{H_2}} \qquad (6)$$

where harmonics $h_{a_2}$ is lower in frequency than second-mixer input frequency $$f_{g_{a_1}}$$

and harmonic $h_{b_2}$ is higher in frequency than second-mixer input frequency $$f_{g_{a_1}}, f_{d_{L_2}}$$

is the lower boundary frequency from the tunable range of second discriminator 42, $$f_{d_{H_2}}$$

is the higher boundary frequency from the tunable range of second tunable discriminator 42 and $f_{k_2}$ is the indicated frequency of second knob 52 on a dial 57.

As a result of mixing operation in second mixer 34 when receiving frequency $$f_{g_{a_1}}$$

there occur two alternative outputs that could be provided from first mixer 18. Of course, if frequency $$f_{g_{b_1}}$$

is used instead of frequency $$f_{g_{a_1}}$$

two other alternative outputs would be provided from the output of mixer 18.

Where harmonic $h_{a_2}$ is used with received frequency $$f_{g_{a_1}}$$

the mixer output is frequency $f_{r_a}$, which may be defined by the following expression:

$$f_{r_a}=f_{g_{a_1}}-h_{a_2}=f_{d_{L_2}}+\Delta f_2 \qquad (7)$$

where $\Delta f_2$ is the difference between the actual tuned frequency of second discriminator 42 and the indicated frequency of third knob 53, as indicated by its associated dial 58. Frequency $\Delta f_2$ may be either positive or negative with respect to the frequency indication of third knob 53. Accordingly, $\Delta f_2$ may be defined by the expression:

$$\Delta f_2=f_{k_2}-f_{g_{a_1}} \qquad (8)$$

On the other hand, if harmonic $h_{b_2}$ is utilized with received frequency $$f_{g_{a_1}}$$

second mixer 34 operates according to the following expression:

$$f_{r_b}=h_{b_2}-f_{g_{a_1}}=f_{d_{H_2}} \qquad (9)$$

If harmonics $h_{a_2}$ is utilized, the used spectrum provided by second generator 32 extends from $$(f_{d_{L_1}}-f_{d_{L_2}}) \text{ through } (f_{d_{H_1}}-f_{d_{L_1}})$$

On the other hand, if harmonic $h_{b_2}$ is used, the utilized spectrum from second generator 32 extends from $$(f_{d_{L_1}}+f_{d_{H_2}}) \text{ through } (f_{d_{H_1}}+f_{d_{H_2}})$$

In regard to the alternative frequencies $h_{a_2}$ and $h_{b_2}$, it will often be preferable to use the lower, which is $h_{a_2}$; and for purposes of explanation of the operation of second-order frequency-comparing section 13, it will be assumed that harmonic $h_{a_2}$ is used and that harmonic $h_{b_2}$ is rejected. Accordingly, the output of second mixer 34 will be frequency $f_{r_a}$ in this operational example.

As long as first-order frequency comparing section 12 is in operation, gate circuit 38 blocks the output of second mixer 34. That is, as long as first-order frequency-comparing section 12 is providing a D. C. output from its discriminator 23 sufficient to control regulator means 11, the D. C. output from first discriminator 23 also is sufficient to control gate circuit 38 to block the output of second mixer 34, thereby preventing the output of mixer 34 from being received by fixed-tuned circuit 41. Accordingly, while gate circuit 38 is blocking the output of second mixer 34, there will be no input provided to second discriminator 42; and it will not then be providing any D. C. output and, therefore, cannot then have any control effect upon the regulator means 11.

Consequently, first-order frequency-comparing section 12 reduces its output to a subthreshold D. C. value, due to its feedback control over frequency $f_0$ through regulator means 11.

When the output of first discriminator 23 falls below its threshold magnitude, it opens gate circuit 38 to permit output frequency $f_{r_a}$ of second mixer 34 to pass to fixed-tuned circuit 41.

Fixed-tuned circuit 41 has a bandwidth that is greater than the tunable range of second discriminator 42, which extends from $$\text{frequency } f_{d_{L_2}} \text{ to frequency } f_{d_{H_2}}$$

Both input frequencies to second mixer 34 will be relatively large. Accordingly, there will be wide frequency spacing between its first-order outputs; and, therefore, fixed-tuned circuit 41 can readily provide the necessary attenuation of the summed mixer output as well as the mixer input frequencies found in its output. Thus, tuned circuit 41 can selectively pass the first-order difference frequency $f_0$.

Second discriminator 42 will be tuned to a frequency $f_{d_3}$ by the setting of the third order knob 53, and dial 58 will indicate a frequency $f_{k_3}$. Therefore, second discriminator 42 will have a tuning error $\Delta f_3$ which may be defined as follows:

$$\Delta f_3 = f_{k_3} - f_{d_3} \quad (10)$$

The frequency error $\Delta f_3$ may be either positive or negative with respect to the frequency indication by third knob 53.

However, any frequency within the tuning range of second discriminator 42 will be small compared to any frequency within the range of variable oscillator 10 or within the range of first discriminator 42. The tuning range boundary frequencies $$f_{d_{L_2}} \text{ and } f_{d_{H_2}}$$

of second discriminator 42 will be any two adjacent harmonics provided from second spectrum generator 42 as low as possible, its boundary frequencies will be chosen between harmonics that are as low as possible and compatible with the tuning range of second discriminator 42.

Therefore, the tunable range of second discriminator 42 will be of the order of $1/n$ times the tunable range of first discriminator 23.

The direct-current output from second discriminator 42 will have either positive or negative polarity depending on whether frequency $f_{r_a}$ is higher or lower than the tuned frequency $f_{d_3}$ of second discriminator 42. The discriminator output voltage will operate regulator means 11 through isolation circuit 26 to vary the frequency of variable oscillator 10 until heterodyned frequency $f_{r_a}$ substantially aligns with the tuned frequency of second discriminator 42.

Furthermore, the error in the stabilized output frequency of variable oscillator 10 will only be $\Delta f_3$, which is the tuning error of second discriminator 42.

The maximum possible error in the stabilized frequency of oscillator 10 can therefore be made a very small fraction of the maximum possible error provided by direct tuning of variable oscillator 10.

Figure 2:
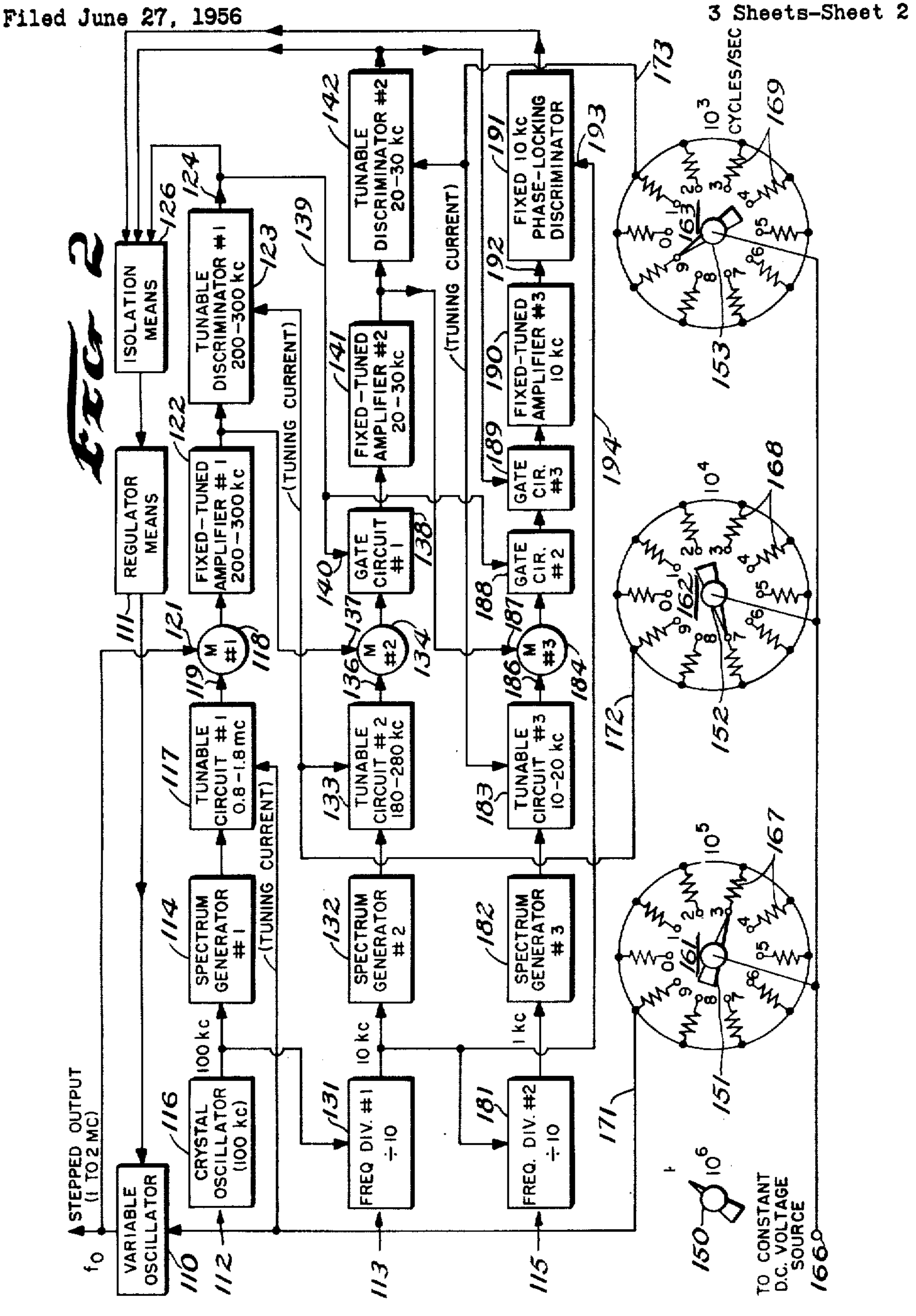
Figure 2 is a particular form of the invention.

Consequently, the system shown in Figure 2 will provide continuous stabilized tuning across the one to two megacycle range of variable oscillator 10, with an error from its indicated frequency of only $\Delta f_3$.

Isolation circuit 26 provides a very high resistance between the output connections of the discriminators. Therefore, a substantial D. C. output provided from second discriminator 42 cannot pass back to affect its gate circuit 38.

Any number of lower-order frequency-comparing sections, similar to second-order frequency comparing section 13, may be added to the network of Figure 1. Each added frequency-comparing section will further reduce the error in the indicated frequency of variable oscillator 10 by another numerical order.

The connection of the second mixer input between any following section and its immediately-preceding higher-order section will be similar to the connection of mixer input 37 of second frequency-comparing section 13 to the heterodyned frequency in first frequency-comparing section 12. That is, the mixer of any added section will receive an input provided by the output of the mixer of the immediately preceding higher-order section.

The gating-circuit means of the added section will include a plurality of gate circuits, in which they are $(n-1)$ in number, where $n$ is the number of the section with the highest-order section considered the first. The gate circuits in each section are respectively controlled by the outputs of the discriminators in the preceding sections.

A stable frequency of a lower order will be provided from the crystal-controlled source for each added section. An additional-tuning means (knob) will be added with each additional section and will be connected to tune the discriminator in the added section. The tuning means (knob) of the discriminator of the immediately preceding higher-order section will be connected to tune the tunable-filter circuit of the added section.

The operation of each added section will be of the same type as described for second-order section 13 in Figure 1 and each further section will provide a further order of stability for the variable-oscillator frequency.

Figure 2 illustrates a decade form of the invention which also phase locks the output frequency of the master oscillator to a subharmonic of the stable frequency source. The system of Figure 2 can also maintain the stability of the variable oscillator to a higher order than that of the stable frequency source.

The stabilized system of Figure 2 similarly includes a variable oscillator 110 which has its output frequency $f_0$ variable between one and two megacycles-per-second. Accordingly, in Figure 2 there is provided a first-order frequency-comparing section 112, a second-order frequency-comparing section 113, followed by a phase-comparing section 115. First and second order sections 112 and 113 are respective species of generic types 12 and 13 described in regard to Figure 1.

A 100 kilocycle-per-second crystal oscillator 116 provides the standard frequency for the system in Figure 2.

First-order section 112 includes a first spectrum generator 114 that receives the 100 kilocycle-per-second output frequency of crystal oscillator 116. Generator 114 provides harmonics over the range from 0.8 to 1.8 megacycles-per-second spaced by 100 kilocycle steps.

A first tunable circuit 117 is provided which is connected to the output of first spectrum generator 114 and passes a selected harmonic $h_{a_1}$ from the range, 0.8 to 1.8 megacycles-per-second.

A first mixer 118 in first-order section 112 has one input 119 connected to the output of first tunable circuit 117, and has its second input 121 connected to the output of variable oscillator 110. It is generally necessary to design first mixer 118 with very little back-coupling between its second input 121 and the output of variable oscillator 110. Otherwise, one way coupling, such as is provided by a cathode follower, should be connected between the output of variable oscillator 110 and input 121 of first mixer 118.

First section 112 also includes a fixed-tuned amplifier 122, and a tunable discriminator 123, with the input to amplifier 122 being connected to the output of first mixer 118 and the input to discriminator 123 being connected to the output of amplifier 122. The tuning range of discriminator 123 is arbitrarily chosen between the second and third harmonics of spectrum generator 114. Therefore, the tuning range of discriminator 123 varies between 200 and 300 kilocycles-per-second. As a result, the fixed band-pass of amplifier 122 includes frequencies between 200 and 300 kilocycles-per-second but should extend on both sides of this range by the amount of the maximum possible direct-tuning frequency error of variable oscillator 110.

Electronic tuning is used in the form of the invention shown in Figure 2; although, as explained above, any type of tuning may be utilized in the invention. Saturable reactors are assumed to be utilized in Figure 2 as the tuning means. In the present state of the art, tuning by saturable reactors is not as stable or accurate as can be obtained by presently known mechanically-operated tuning means. However, the direct-tuning accuracy presently available with saturable reactors is sufficiently accurate for use in this invention.

In the present state of the art, saturable-reactor tuning can be provided with a tuning error of not more than plus or minus one to two percent.

Thus, it is assumed in Figure 2 that variable oscillator 110 and all the tunable circuits, including all tunable discriminators, are tuned by saturable reactors.

The system illustrated in Figure 2 also provides a decade indication of its stabilized output frequency $f_o$. Decade indication is very important in the practical utilization of most systems that generate a large plurality of frequencies. Accordingly, in Figure 2, the knobs 150, 151, 152, and 153, which control the tuning of the system, also indicate the output frequency of variable oscillator 110 in a decade manner. Thus, each knob has ten positions, which are numbered with the basic decade digits, 0 through 9.

First-order knob 151 provides direct-manual tuning for variable oscillator 110 and for first tunable circuit 117. The ten positions of first knob 151 manually tune variable oscillator 110 to ten frequencies from one megacycle to 1.9 megacycles in 100 kilocycles-per-second increments; and this tuning will be assumed to have an accuracy of about +2 percent. Therefore, at the highest direct frequency setting of variable oscillator 110 by knob 151, there will be a maximum frequency error of +38 kilocycles. That is, when knob 151 is set to its highest point, digit 9, variable oscillator 110 will provide an output frequency that will be somewhere between 1862 kilocycles-per-second and 1938 kilocycles-per-second. It will be shown later that the invention can remove the entire possible +38 kilocycle error.

First-order knob 151 operates a single-pole ten-contact tap switch 161; and the pole of switch 161 is connected to a terminal 166, which provides a constant-amplitude D. C. voltage. This voltage, for example, may be controlled by a voltage-regulator tube.

A plurality of ten resistors 167 are each connected at one end to a different one of the ten contacts of tap switch 161. The other ends of resistors 167 are connected to a lead 171 which has its other end connected to the saturable-reactor tuning element within variable oscillator 110 and also to the saturable-reactor tuning element within first-tunable circuit 117. Each of the resistors 167 has a different resistance value, which controls the current provided to the connected saturable reactors, in order to tune them to the required values. Thus, each of the ten positions of first knob 151 selects a different resistor and, therefore, a different current value for tuning the saturable reactors in variable oscillator 110 and in first-tunable circuit 117.

A dummy knob 150 is provided which always indicates the digit one, with a numerical order of $10^6$ in the indication of the output frequency of variable oscillator 110. Hence, the output frequency will have a fixed indication of its first digit, representing the one megacycle in its frequency which varies from one megacycle to 1.999 megacycles in one kilocycle steps. Thus, there are ten frequency readings provided by the combination of knobs 150 and 151, to indicate the ten directly selectable frequencies by knob 151 to provide frequencies which extend from 1 to 1.9 megacycles in 100 kilocycle steps, with an error +2 percent.

Since the tuning range of first-tunable circuit 117 is from 0.8 to 1.8 megacycles in 100 kilocycle-per-second steps, some tracking is necessary between variable oscillator 110 and first-tunable circuit 117. Some tracking error is permissible without affecting the operation of the system.

If it is found that the single set of resistors 167 in Figure 2 does not permit sufficient tracking, a more precise tracking system may be provided as follows: An additional set of ten resistors (not shown) may also be connected respectively at one end to the ten contacts of switch 161 in the same manner as resistors 167. However, the common ends of the second set of resistors is connected only to the tuning reactor in first-tunable circuit 117; and the common ends of resistors 167 are connected only to the tuning element of variable oscillator 110. Hence, at any setting of knob 151, resistors that are independently proportioned will separately determine the tuned frequencies of variable oscillator 110 and first-tunable circuit 117. No tracking difficulties can then occur. The same system may be used for any other rotary switches in the stabilized frequency system. This, in effect, provides a separate set of ten resistors for each tunable element.

Second-order frequency-comparing section 113 receives a ten kilocycle-per-second stable input frequency from a first frequency divider 110, which receives the output of crystal oscillator 116 and divides it by ten.

A spectrum generator 132 receives the 10 kilocycle frequency and provides a spray of output harmonics, which include harmonics between 180 and 280 kilocycles-per-second in ten kilocycle steps. A tunable circuit 133 connects to the output of spectrum generator 132 and selectively passes one of the harmonics in this range.

A second mixer 134 is included in second section 113 with one input 136 connected to the output of tunable circuit 133 and with its other input 137 connected to the output of fixed-tuned amplifier 122 in first-order section 112 to receive the heterodyned frequency of section 112.

A first gate circuit 138 is serially connected between the output of mixer 134 and the input to a fixed-tuned amplifier 141. Gate circuit 138 has a control input 140, which is connected by a lead 139 to the D. C. output of first tunable discriminator 123.

A second tunable discriminator 142 connects to the output of fixed-tuned amplifier 141 to complete the components in second-order section 113. The tunable range for second discriminator 142 is chosen in this example to be between the second and third harmonics of second spectrum generator 132. Accordingly, its range lies between the frequencies of 20 and 30 kilocycles-per-second. Thus, fixed-tuned amplifier 141 must have a band-pass that extends beyond 20 and 30 kilocycles-per-second by the amount of any maximum possible received error.

Second-order section 113 is assumed in this example to utilize the harmonic $H_{a_2}$, which is selected by second tunable circuit 133 and is defined by expression (5) above.

Second adjustable knob 152 is provided to directly tune first tunable discriminator 123 in first-order section 112 and tunable circuit 133 in second-order section 113. Thus, second adjustable knob 152 accomplishes a function similar to second knob 52 in Figure 1.

A single-pole ten-contact tap switch 162 is operated by knob 152. Ten resistors 168 connect respectively at one end to a different contact of switch 162. The opposite ends of resistors 168 are connected in common to a lead 172 that is connected at its other end to the tuning reactors in first discriminator 123 and second tunable circuit 133. Thus, switch 162 with its resistors 168 accomplishes tuning in the same manner as is done by switch 161 with its associated circuitry; and the same tracking problems occur, which can be solved in substantially the same way as was suggested for the circuitry associated with first knob 151. Therefore, the ten settings of second switch 152 provide ten tuned frequencies for first discriminator 123 between 200 and 300 kilocycles-per-second in ten kilocycle increments. Also, second knob 152 tunes second tunable circuit 133 between 180 and 280 kilocycles in 100 kilocycle-per-second steps.

First tunable discriminator 123 is also assumed to be tuned by knob 152 with a maximum possible error of +2 percent. However, any frequency in the tuning range of first discriminator 123 is only about ⅕ of any absolute frequency in the range of variable oscillator 110. Therefore, the output of the highest order section 112, provided by its tunable discriminator 123 decreases the frequency error of variable oscillator 110 to ⅕ of the error obtained with only direct tuning of variable oscillator 110.

When first discriminator 123 has accomplished its maximum stabilization of variable oscillator 110, it provides a D. C. output that is below the threshold level required to further vary regulator means 111. Then, first gate 140 is opened to enable second-order frequency-comparing circuit 113 to accomplish a further order of stabilization of output frequency $f_0$.

After maximum stabilization by first-order section 112, any frequency error that remains in the output of variable oscillator 110 will exist in input 137 to second mixer 134, since variable oscillator frequency $f_0$ was heterodyned in first mixer 118 to the 200 to 300 kilocycle-per-second range by a substantially errorless crystal harmonic.

In second mixer 134, the remaining absolute-frequency error is heterodyned downwardly by another substantially errorless crystal-controlled harmonic to the 20 to 30 kilocycles-per-second frequency range, which is the range of second discriminator 142. The low-frequency stability of second discriminator 142 is now utilized to further stabilize the remaining frequency error of variable oscillator 110.

This follows because the absolute-frequency of second discriminator 142 is only about $1/10$ of the absolute-frequency of first discriminator 123, because any frequency within the range of second-tunable discriminator 142 is only about $1/10$ of any frequency within the range of first discriminator 123. The output of second-tunable discriminator 142 therefore provides a D. C. voltage which operates regulator means 111 to adjust variable oscillator 110 until its frequency error is within the range of error of second discriminator 142.

Thus, the output of second discriminator 142 decreases the previously existing frequency error in the output of variable oscillator 110 to about $1/10$ of the error that existed after maximum stabilization by first-order section 112. Hence, with the second-order section 113 utilized (and ignoring any further sections), variable oscillator frequency $f_0$ indicated by knobs 150, 151, 152, and 153 will have only about $1/50$ the frequency error that there would exist with only direct manual tuning of variable oscillator 110.

A phase-locking frequency-comparing section 115 is also provided in Figure 2, which eliminates all remaining frequency error in the tuning of variable oscillator 110, except for the generally-negligible instability of a submultiple of the crystal oscillator frequency. The submultiple frequency is more stable than the crystal-oscillator frequency by the order of the submultiple.

A second frequency divider 181 provides the frequency source for phase-comparing section 115. Divider 181 is connected to the 10 kilocycle output of first divider 131 and divides it by ten to provide an output frequency of one kilocycle.

Phase-locking frequency-comparing section 115 includes a third spectrum generator 182, which receives the one kilocycle-per-second frequency provided from a second frequency divider 181. The output of third spectrum generator 182 includes a spray of harmonics between 10 and 20 kilocycles-per-second that are spaced by one kilocycle increments.

A tunable circuit 183 connects to the output of spectrum generator 182 and selectively passes one harmonic within the range of 10 to 20 kilocycles-per-second.

A third mixer 184, which is the mixer for section 115, has one input 186 connected to the output of tunable circuit 183 and has a second input 187 connected to the output of fixed-tuned amplifier 141 in second-order section 113.

A second gating circuit 188 and a third gating circuit 189 are provided, which connect in series between the output of third mixer 184 and the input to a fixed-tuned amplifier 190, which is tuned to 10 kilocycles. Second-gate circuit 188 is controlled by the output of first discriminator 123; and third-gate circuit 189 is controlled by the output of second discriminator 142. Gate circuits 188 and 189 respectively permit passage of the output of third mixer 184 when their controlling discriminators both provide outputs below a given threshold level.

A fixed-tuned phase-locking discriminator 191, tuned to ten kilocycles-per-second, has one input 192 connected to the output of fixed amplifier 190, and has its second input 193 connected by a lead 194 to the ten kilocycle output of first frequency divider 131.

Third adjustable knob 153 controls the tuning of second discriminator 142 and third tunable circuit 183. Like knobs 151 and 152, third tuning knob 153 operates a single-pole ten-contact tap switch 163, which is associated with ten resistors 169, each respectively connecting at one end to one of ten contacts. A lead 173 connects in common to the opposite ends of the ten resistors 169; and lead 173 connects at its other end to the saturable-reactor tuning elements in second discriminator 142 and third tunable circuit 183. Where difficult tracking problems occur, an arrangement of dual resistors may be provided with knob 153 as was suggested above regarding knob 151.

The frequency range of third tunable circuit 183 is somewhat arbitrary; but it must select a harmonic, which will beat with third mixer input 184 to provide a mixer output of ten kilocycles-per-second, plus or minus any remaining frequency error. Since amplifier 190 is fixed tuned, it can have high selectivity to easily attenuate spurious harmonics. It is, of course, desirable for third tunable circuit 183 to have as much rejection as possible of spurious components, because a degree of phase modulation may result from such spurious components. Accordingly, it is preferable to obtain a tuning range for tunable circuit 183 that is as low as possible.

Thus, any frequency error existing in the output of variable oscillator 110, after maximum stabilization by second-order section 113 will exist in third mixer input 187, provided by heterodyning in second mixer 134. Consequently, any frequency error existing at input 187 to mixer 184 will be provided from the output of mixer 184 to phase-locking discriminator 191. The output frequency of mixer 184 will be 10 kilocycles plus or minus any error existing in the heterodyned frequency received from second section 113. This error containing frequency is applied as phase detector input 192 and it is first frequency compared and then is phase compared against the ten-kilocycle crystal derived frequency input 193 to provide a direct current from the phase-locking discriminator 191. This D. C. output actuates regulator means 111 to adjust the frequency of variable oscillator 110 until third mixer input frequency 187 has no error and heterodynes down to exactly a ten kilocycle-per-second signal that phase locks with the crystal-derived ten-kilocycle signal in discriminator 191.

Phase-locking discriminator 191 can be a combination of a frequency discriminator and a phase detector, wherein the frequency discriminator provides the output of section 115 as long as the phase detector has an A. C. output, after which the phase-detector's D. C. output obtains control of the system.

A specific example of operation by the system of Figure 2 will be given. Let it be assumed that it is required to obtain a stabilized frequency of 1379 kilocycles-per-second from the output of variable oscillator 110. Dummy knob 150 indicates the first digit of the desired frequency to provide the fixed digit having a weight of $10^6$ cycles-per-second (one mc.). First-order rotatable knob 151 is set to position 3 to indicate the second digit in the desired frequency which has a weight of $10^5$ cycles-per-second. Second-order knob 152 is set to the digit 7, which is the third digit in the desired frequency having a numerical weight of $10^4$ cycles-per-second. And, third-order knob 153 is set to the digit 9, which is the last digit in the desired frequency and has a numerical weight of $10^3$ cycles-per-second. Thus, the settings of the knobs in Figure 2 provide a direct reading of the output frequency $f_0$ of variable oscillator 110.

When knob 151 in initially adjusted, it roughly tunes variable oscillator 110 to a frequency of 1300 kilocycles-per-second with an error of +2 percent. Let it be assumed that +2 percent error of 26 kilocycles-per-second occurs, which initially provides an actual variable-oscillator frequency of 1326 kilocycles-per-second. Also, the settings of knob 151 tunes circuit 117 to select the 1.1 megacycle harmonic from the output of spectrum generator 114. The ten positions of knob 151 select a different one of the ten harmonics in the range of 0.8 to 1.8 megacycles-per-second in increasing correlation with the digit indications 0–9.

The 1.1 mc. harmonic is injected as input 119 into first mixer 118. First mixer 118 therefore heterodynes the initial oscillator frequency of 1326 kilocycles-per-second with the 1.1 megacycle harmonic to provide an output frequency of 226 kilocycles-per-second, which lies within the fixed band-pass of first amplifier 122, and is received by first-tunable discriminator 123.

First-tunable discriminator 123 was tuned by setting knob 152 to digit 7 which is 7/10 of its frequency range from its lower-frequency boundary and, therefore, is tuned to around 270 kilocycles-per-necond with a +2 percent error. It is assumed that discriminator 123 is tuned with an error of +2 percent, or 5.4 kilocycles-per-second. As a result, discriminator 123 is actually tuned to 275.4 kilocycles and provides a direct-current output due to the 49.4 kilocycle-per-second difference between the 226 kilocycle input signal and the 275.4 exact-tuned frequency of discriminator 123. In this situation discriminator 123 must have a sufficient D. C. response to sense an input which is 49.4 kilocycles-per-second from its tuned frequency. This D. C. output operates regulator means 111 to tune variable oscillator 110 in a manner that changes its output frequency upwardly by about the 49.4 kilocycles difference, until the input to first discriminator 123 approaches its tuned frequency of 275.4 kilocycles-per-second.

The worst condition for discriminator 123 is when it is tuned to 295.2 kilocycles which is at setting of 290 kilocycles by knob 151 with a +2 percent error, and the initial variable oscillator frequency is 1274 kilocycles, which is 1300 kilocycles with a −2 percent error. This provides an input frequency of 174 kilocycles to discriminator 123 when it is set to 295.2 kilocycles. In this worst situation, discriminator 123 must provide a sufficient D. C. output to operate the regulator means in order to pull the 174 kilocycle input toward the tuned frequency of the discriminator.

However, in this example, it may be assumed that the input frequency to discriminator 123 does not quite reach 275.4 kilocycles by about a 2 percent error, because then its D. C. output falls below the threshold level required to operate regulator means 111. Thus, first discriminator 123 loses control over variable oscillator 110 when its input frequency reaches about 273.4 kilocycles-per-second. When this state of events occurs, variable oscillator 110 provides an output frequency of 1373.4 kilocycles-per-second, which is in error by 3.4 kilocycles from the 1370 kilocycle setting of knobs 150, 151, and 152.

It is realized that up to this time, the remaining comparison sections 113 and 115 have not operated and have, thus far, had no effect upon stabilizing variable oscillator 110. Accordingly, the setting of third order knob 153 has, thus far, had no effect upon the system. Hence, at this instant, it is only the readings of first three knobs 150, 151, and 152 which indicate the output frequency of variable oscillator 110.

However, when the output of discriminator 123 goes below the threshold level necessary to operate the regulator means, first gate circuit 138 is opened in second-order section 113 to permit the output of second mixer 134 to reach second-tunable discriminator 142.

The setting of rotatable knob 152 tunes second tunable circuit 133 to select a harmonic from the output of spectrum generator 132. The increasingly-higher numbered positions of knob 152 select an increasingly-higher harmonic as the output of tunable circuit 133. Thus, when knob 152 is set at digit zero, it selects the 180 kilocycle-per-second harmonic, and when it is set to 7, as indicated, it selects the 250 kilocycle-per-second harmonic and injects it into second mixer 134.

Thus, second mixer 134 heterodynes the 250 kilocycle harmonic with the previously heterodyned 273.4 kilocycle-per-second frequency received from first-order section 112. Consequently, second mixer 134 provides an output frequency of 23.4 kilocycles-per-second, which is now passed by gate circuit 138 through fixed-tuned amplifier 141 to second-tunable discriminator 142. It lies within the 20 to 30 kilocycle ranges of amplifier 141 and discriminator 142.

Second discriminator 142 is, however, tuned by third rotatable knob 153 to 9/10 of the way from its lower-boundary frequency of 20 kilocycles. Thus, discriminator 142 is tuned to 29 kilocycles-per-second with a +2 percent error, which is 0.58 kilocycle. If the error is assumed to be positive, second discriminator 142 is tuned to an exact frequency of 29.58 kilocycles. Accordingly, it provides a direct-current output which will be proportional to the 6.18 kilocycle-per-second difference between its tuned frequency and the initial incoming frequency of 23.4 kilocycles. The D. C. output of second discriminator 142 then controls the adjustment of varable oscllator 110 until its frequency is moved upward by something less than 6.18 kilocycles to provide an output D. C. magnitude from discriminator 142 that is below the threshold level required to operate regulator means 111. It may be assumed that the D. C. output of second discriminator 142 drops below the threshold level when the discriminator input frequency is about 2 percent away from its exact-tuned frequency, which is about 0.59 kilocycle in this example. Consequently, the variable-oscillator frequency is varied by regulator means 111 until it provides an input frequency of 28.99 kilocycles-per-second to the second discriminator 142, which corresponds to a variable-oscillator output frequency of 1378.99 kilocycles-per-second for an error of 0.01 kilocycle from the indicated frequency.

Furthermore, when the output from second-tunable discriminator 142 falls below the required threshold level, third gate circuit 189 in frequency-and-phase-comparing section 115 is opened to pass the output of third mixer 184 to phase-locking discriminator 191. Second gate circuit 188 was previously opened when the output of first discriminator 123 went below the given threshold level. However, second gate circuit 188 is necessary to prevent any output from frequency-and-phase-locking discriminator 191 when second discriminator 142 is not providing any output due to it being blocked by first gate circuit 138 by operation of first section 112.

The setting of third rotatable knob 153 has a consecutively increasing correlation with the harmonic selected by third tunable circuit 183. Thus, when knob 153 is set to the digit, zero, third tunable circuit 183 selects the 10 kilocycle harmonic; and when knob 153 is set to the digit, 9, third tunable circuit 183 selects the 19 kilocycle-per-second harmonic.

Accordingly, third mixer 184 receives the 19 kilocycle harmonic as one input and receives a second input of 28.99 kilocycles, which is the heterodyned frequency of second-order frequency-comparing section 113. Consequently, third mixer 184 provides a heterodyned output of 9.99 kilocycles, which includes the 0.01 kilocycle error.

Since second and third gate circuits 188 and 189 are now open, the 9.99 kilocycle signal is provided as one input to phase-locking discriminator 191, which compares it to the crystal-controlled ten-kilocycle signal.

Phase-locking discriminator 191 acts as a frequency discriminator when a frequency difference exists between its input signals, and it acts as a phase discriminator when a phase difference less than 90 degrees exists between its two input signals.

Consequently, phase-locking discriminator 191 will provide a D. C. output that operates regulator means 111 to adjust the frequency of variable oscillator 11 until phase-detector input 192 exactly aligns in both frequency and phase with its stabilized 10 kilocycle input 193. As a result, regulator means 111 regulates variable oscillator 110 until second input 187 of third mixer 184 increases by 0.01 kilocycle to exactly 29 kilocycles, which provides an exact heterodyned frequency of ten kilocycles-per-second that is phase-locked with the ten-kilocycle output from crystal-controlling frequency divider 131.

Figure 3:
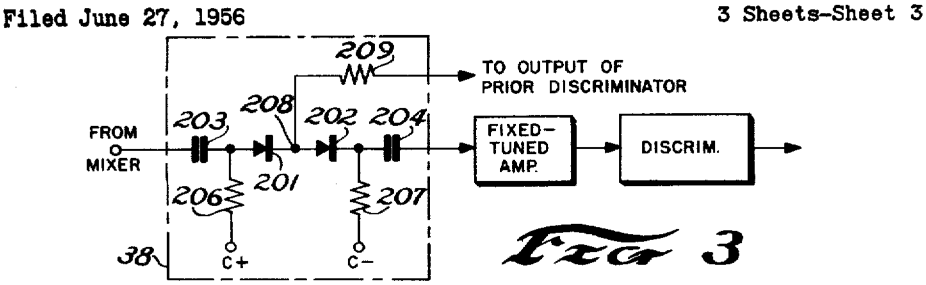
Figures 3 and 4 are types of gate circuits which may be utilized in the invention; and, Figure 5 illustrates an isolation circuit which may be used in the invention.
Figure 4:
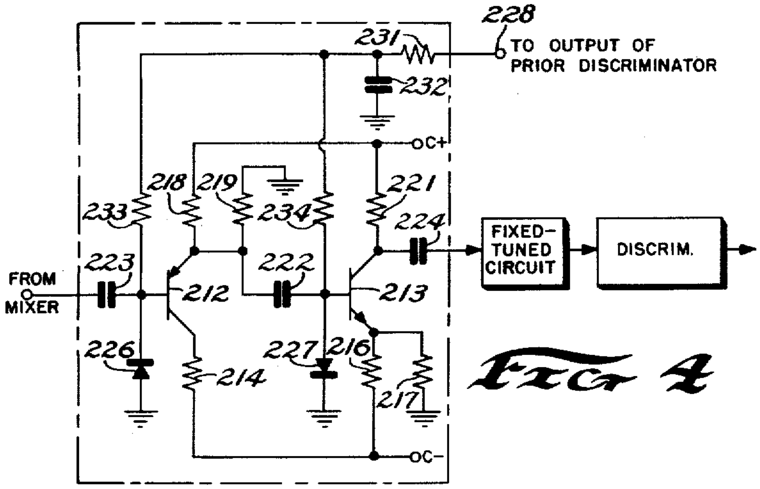

Figures 3 and 4 illustrate examples of gate circuits, which may be used as circuit 38 in Figure 1 or as circuits 138, 188 and 189 in Figure 2. The location of a gate circuit in a section may be anywhere between the output of the mixer and the input of the discriminator. A place where the signal level is lowest is preferable, therefore, they are placed before the fixed-tuned amplifiers in Figure 2. Hence, clipping of the signal is less likely to occur when it passes through these types of gate circuits.

Gate circuit 38 in Figure 3 comprises a pair of diodes 201 and 202, which are serially connected with like-series polarity with a pair of capacitors 203 and 204, connected serially to opposite ends of the diodes.

The diodes are normally biased to a conducting state by a C-plus positive direct-voltage supply and a C-minus negative direct-voltage supply. The C-plus source is connected through a resistor 206 to a common point between capacitor 203 and diode 201. Similarly, the C-minus source is connected through a resistor 207 to a common point between the other diodes 202 and the other capacitor 204. A common point 208 between the diodes is connected through a resistor 209 to the output of the prior discriminator, which in Figure 1 would be the output of first discriminator 23. Accordingly, if the C-plus voltage is assumed to be one-half volt positive, and the C-minus voltage is assumed to be one-half volt negative, and one-half volt is also assumed to be the threshold voltage level for regulator means 11, the gate circuit is open as long as the direct-voltage provided from the prior discriminator has a value within one-half volt.

However, when the prior discriminator provides a voltage above the threshold level, one of diodes 201 and 202 will be biased below cutoff, depending upon the polarity of the discriminator output voltage. Then, a mixer output received by the gate circuit will be blocked and will not pass to the fixed-tuned amplifier connected to its output.

The gate circuit in Figure 4 operates basically in a manner similar to the circuit in Figure 3. However, it has much greater sensitivity due to amplification devices included within it. It includes a pair of transistors 212 and 213 with the collector of first transistor 212 connected through a resistor 214 to the C-minus source. The emitter of second transistor 213 is connected through another resistor 216 to the C-minus source. Another resistor 217 is connected between the emitter of second transistor 216 and ground. In effect, resistors 216 and 217 provide a voltage-divider circuit for controlling the emitter-biasing voltage of second transistor 213.

In a like manner, the C-plus source is connected through a resistor 218 to the emitter of first transistor 212; and the C-plus source is also connected through another resistor 221 to the collector of the other transistor 213. Also, a resistor 219 is connected between ground and the emitter of first transistor 212 to provide a voltage divider that controls the emitter bias.

A capacitor 222 is connected between the emitter of first transistor 212 and the base of second transistor 213 to couple the signal. The base of first transistor 212 is connected to the signal source, provided by the prior mixer, through a capacitor 223. Furthermore, the output of the gate circuit, when it is not blocked, is provided through another capacitor 224, which connects serially to the collector of second transistor 213.

A first diode 226 is connected between ground and the base of first transistor 212; and a second diode 227 is connected between ground and the base of second transistor 213. Diodes 226 and 227 are connected with opposite polarity with respect to ground. Terminal 228 of the gate circuit connects to the direct-current output of a discriminator in a higher-order frequency-comparing section. A resistor 231 and a capacitor 232 connect between terminal 228 and ground to provide a low-pass filter that suppresses any radio-frequency components that may exist in the discriminator output. Another resistor 233 connects between the base of first transistor 212 and the ungrounded side of capacitor 232; and similarly, another resistor 234 connects between the base of second transistor 213 and the ungrounded side of the capacitor 232.

The gate circuit in Figure 4 can be adjusted so that very small magnitudes of discriminator-output voltage can control its blocking state. Furthermore, the amplification provided by transistors 212 and 213 may make it unnecessary for there to be other amplification following the mixer. Then, the tuned amplifier need only be a passively tuned circuit to suppress the undesired outputs from the mixer.

Figure 5:
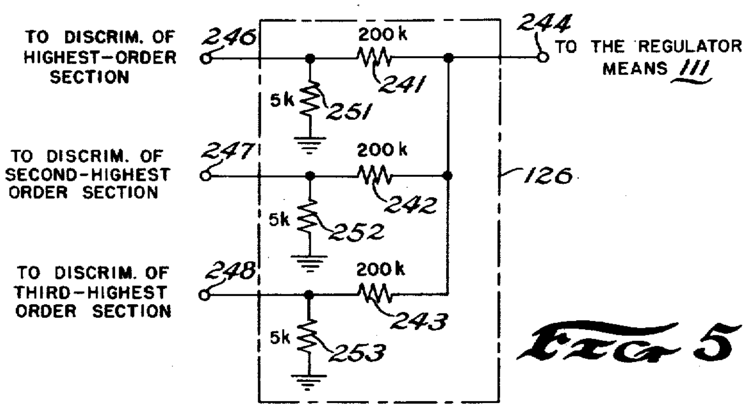

Figure 5 shows one of many types of isolation circuits, which may be provided for isolation circuit 126 in Figure 2. It comprises a resistor network and includes three resistors 241, 242, and 243, which have one end connected in common to a terminal 244 that connects to regulator means 111. The opposite end of resistor 241 connects to a terminal 246 that is connected to the output of highest-order discriminator 123. The other end of second resistor 242 is connected to a terminal 247, which is connected to the output of the second-highest order discriminator 142. And, third resistor 243 is connected to a terminal 248, which is connected to final discriminator 191. Also, three resistors 251, 252, and 253 are respectively connected between ground and terminals 246, 247, and 248. Isolation is provided between terminals 246, 247, and 248 when resistors 241, 242, and 243 are large in resistance value compared to resistors 251, 252, and 253, respectively.

Another type of isolation circuit (not shown) may be used with systems having two frequency-comparing sections of the type shown in Figure 1, by using a single-pole double-throw vibrating switch (not shown), commonly known as a chopper, as a first component in regulator means 111. Isolation is obtained by connecting the respective discriminator outputs to opposite input contacts of the chopper. Accordingly, the pole, which provides the chopper output, only engages one input terminal at one time, at which instant the other discriminator output is open-circuited.

In some situations the structure of the invention may be simplified by eliminating the fixed-tuned filter and utilizing the output of the tuned circuit of the tunable discriminator as the means for selecting the first-order frequency difference output from the mixer. In this case, the second input to the mixer in the next-lower-order section will be connected to the output of the tuned circuit of the prior discriminator.

Although this invention has been described with respect to particular embodiments thereof, it is not to be so limited as changes and modifications may be made therein which are within the full intended scope of the invention as defined by the appended claims.

I claim:

1. A stabilized-variable oscillator including a first-order frequency-comparing section, a second order frequency-comparing section, first and second means for providing fixed stable oscillations that are harmonically related; each of said frequency-comparing sections including a spectrum generator connected to a different one of said stable oscillation means to generate a spray of harmonics, tunable circuit means connected to the output of said spectrum generator to selectively pass one of the harmonics from said spectrum generator, a mixer having one input connected to said tunable circuit means, and tunable frequency-discrimination means having its input connected in series with the output of said mixer; the stable oscillation means of said second-order section having a lower order output than the stable oscillation means of said first-order section, means connecting the other input to the mixer in said first-order frequency-comparing section to the output of said variable oscillator, means connecting the other input to the mixer in said second-order frequency-comparing section in series with the output of the mixer in said first-order frequency-comparing section, gate-circuit means in said second-order section connected in series between the output of its mixer and the input of its frequency discrimination means, the control input of said gate-circuit means being connected to the output of said frequency-discrimination means in said first-order frequency-comparing section, with said gate-circuit means blocking its received mixer output only when said first-order frequency-discrimination means provides a substantial D. C. output, regulator means having its output connected to said variable oscillator to finely regulate its frequency, and isolation means connecting the outputs of both of said frequency-discrimination means to the input of said regulator means in order to maintain a high impedance between the outputs of the two frequency-discrimination means.

2. A variable oscillator stabilized by crystal-controlled reference frequency means that provides fixed frequencies $f_1$ and $f_1/n$ where $n$ is an integer, comprising a first-order frequency-comparing section having first spectrum generating means receiving said frequency $f_1$ and generating a plurality of harmonics, first tunable-circuit means connected to the output of said spectrum generating means to selectively pass one generator harmonic, a first mixer having one input connected to said tunable-circuit means and having another input connected to the output of said variable oscillator, first tunable discriminator means having its input connected in series with the output of said first mixer; a second-order frequency-comparing section comprising a second spectrum generator receiving said frequency $f_1/n$, second tunable-circuit means connected to the output of said second spectrum generator to selectively pass one of the generator output harmonics, a second mixer having one input connected to the output of said second tunable-circuit means, means for connecting the other input of said second mixer in series with the output of said first mixer, gate-circuit means connected serially to the output of said second mixer for passing the output of the second mixer when the magnitude of the output from said first tunable-frequency discriminator is below a given value, a second tunable-frequency discriminator having its input connected in series with the output of said gate circuit means, regulator means having its output connected to said variable oscillator to finely regulate its frequency, isolation means connecting the outputs of said first and second tunable discriminators to the input of said regulator means and isolating the outputs of said discriminators from each other, means for simultaneously tuning said variable oscillator and said first tunable-circuit means, second means for simultaneously tuning said second tunable-circuit means and said first-tunable discriminator, and third means for tuning said second tunable discriminator.

3. Means for stabilizing a variable oscillator against a crystal-controlled frequency source providing a first reference frequency $f_1$ and a second subharmonically related frequency $f_2$, including a first-order frequency-comparing section comprising harmonic generating means connected to said source to receive said first reference frequency $f_1$ and to provide therefrom a harmonic spectrum, first mixing means having a pair of inputs, first tunable filtering means connected between the output of said first harmonic generator and one input to said first mixing means to pass a selected harmonic, the other input of said first mixing means serially connected to the output of said variable oscillator, and first tunable frequency-discriminator means having its input connected in series with the output of said first mixer; a second-order frequency-comparing section comprising a second harmonic generating means connected to said source to receive said frequency $f_2$ and to provide therefrom a harmonic spectrum, a second mixing means having a pair of inputs, second tunable filtering means connected between the output of said second harmonic generating means and one input of said second mixing means to selectively pass one of the harmonics, the other input of said second mixing means being connected in series with the output of said first mixing means, a second tunable discriminator, a gate circuit connected in series between the output of said second mixing means and the input to said second tunable discriminator, control means connecting said gate circuit to the output of said first tunable discriminator to open said gate circuit only when the output of said first discriminator is below a given magnitude; regulator means for finely controlling the frequency of said variable oscillator in response to the outputs of said first and second discriminators, isolation means provided between the outputs of said discriminators in their connections to said regulator means, means for simultaneously providing an initial tuned setting for said variable oscillator and said first tunable circuit, means for simultaneously providing an initial tuned setting for said second tunable circuit and said first tunable discriminator, and means for simultaneously providing an initial tuned setting for said second tunable discriminator.

4. Means for stabilizing the frequency of a variable oscillator against a crystal-controlled frequency source providing a plurality of reference output frequencies that are related in harmonic fashion: including a first-order frequency-comparing section, comprising means for heterodyning said variable-oscillator frequency with a harmonic derived from one of said reference frequencies, frequency-discrimination means tuned to a lower order of magnitude than said variable oscillator with its input connected in series with the output of said heterodyning means for providing a D. C. output; a second-order frequency-comparing section, comprising second heterodyning means for heterodyning the output of said first heterodyning means with a selected harmonic derived from another of said reference frequencies having a lower order than said first-mentioned reference frequency, second tunable frequency-discriminator means, for providing a D.-C. output, gate-circuit means serially connected between the input to said second discriminator means and the output of said second heterodyning means to pass said second heterodyned output to said second discriminator only when the output of said first discriminator means is below a given threshold magnitude, said second discriminator means tuned to a lower order of frequency than said first discriminator means, and regulator means for adjusting the frequency of said variable oscillator in response to the outputs of said first and second discriminator means.

5. Means for stabilizing the frequency of a variable oscillator against plural and integrally-related frequencies derived from a source more stable than said variable oscillator, comprising a first-order frequency-comparing section including means for deriving a harmonic frequency from one of said stable frequencies of said source, means for heterodyning said harmonic frequency with the output of said variable oscillator, and first frequency-discriminator means tuned to the same order of magnitude as said first selected stable frequency; a second-order frequency-comparing section including second means for deriving a harmonic frequency from a lower order of said stable frequencies than said first utilized source frequency, second means for heterodyning said second selected harmonic with the output of said first heterodyning means, second frequency-discriminator means, gate-circuit means for passing the output of said second heterodyning means to the input of said second frequency-discriminator means only when the output of said first frequency-discriminator means is below a given threshold magnitude, and regulator means for finely adjusting the output frequency of said variable oscillator in response to the outputs of said first and second frequency-discriminator means.

6. A stabilized variable oscillator as in claim 5 also including a first-tuning means for simultaneously tuning said variable oscillator and said first harmonic-deriving means, second tuning means for simultaneously tuning said first frequency-discriminator means and said second harmonic-deriving means, and third tuning means for tuning said second frequency-discriminator means.

7. Means for stabilizing the output frequency of a variable oscillator with a plurality of integrally-related reference frequencies provided from a more stable source, comprising a first-order frequency-comparing section, including means for deriving a harmonic frequency from one of said reference frequencies, means for heterodyning said variable-oscillator frequency with the output harmonic of said first harmonic-deriving means, and first frequency-discriminating means having its input connected to the output of said first heterodyning means; a plurality of consecutively lower-order frequency-comparing sections, including a second-order frequency-comparing section as the highest-order section in said plurality; each of said plurality of sections comprising means for deriving a harmonic frequency from a consecutively lower-order one of said reference frequencies in correlation with the order of the respective section, means for heterodyning the harmonic output of its harmonic-deriving means with the output of the heterodyning means in the immediately preceding higher-order section, frequency-discriminating means, gating-circuit means connected between the output of its heterodyning means and the input to its frequency-discriminating means, control means connecting said gating circuit means to the output of the frequency-discriminating means in each of the higher-order sections to permit said gating circuit means to pass its received heterodyned frequency only when the outputs of all of the higher-order frequency-discriminating means are below a given threshold magnitude; and regulator means for finely adjusting the output frequency of said variable oscillator in response to the outputs of said frequency-discriminating means.

8. A system as defined in claim 7 including first tuning means for simultaneously tuning said variable oscillator and said first harmonic-deriving means, a plurality of additional tuning means having consecutively lower-order tuning control, each of said additional tuning means tuning the harmonic-deriving means in the frequency-comparing section having the same order, and each of said additional tuning means also tuning the frequency-discriminating means in the adjacent higher-order section.

9. A system as defined by claim 7 for phase locking the variable-oscillator frequency to a harmonic of one of said reference frequencies, including a final section having means for deriving a harmonic frequency from the lowest of said reference frequencies, last means for heterodyning said harmonic frequency with the heterodyned output of the mixer in the penultimate section, phase-locking discriminating means having one of its inputs connected in series with the output of said last heterodyning means, said phase-discriminating means having its other input connected to one of said reference frequencies, final gate-circuit means connected between the other input of said phase-locking discriminating means and the output of said last mentioned heterodyning means, and control means connecting said gate-circuit means to the output of each of said frequency-discriminating means in each higher-order section to open said final gate-circuit means when all prior frequency-discriminating means each provides an output below a given threshold magnitude.

10. Means for stabilizing the output frequency of a variable oscillator by a more stable fixed-frequency source that provides a plurality of integrally-related reference frequencies, comprising a plurality of frequency-comparing sections; each of said frequency-comparing sections having a different order of magnitude, with each of said frequency-comparing sections receiving a different one of said reference frequencies having respective like-orders of magnitude, each of said frequency-comparing sections having frequency-discriminating means tunable to frequencies that are of the same order of magnitude as the reference frequency received by the respective section, means included within each of said sections for generating and selecting required harmonics from its respective reference frequency, the highest-order frequency-comparing section including means for heterodyning a selected output harmonic from its generating means and the output frequency of said variable oscillator, with the input to the frequency-discriminating means of said highest-order section connected in series with the output of its heterodyning means, each lower-order section having a respective heterodyning means for heterodyning a selected output harmonic of its respective harmonic generating means and the output of the heterodyning means in the adjacent higher-order section, with gate-circuit means, included with each lower-order section and being connected in series between the input of its frequency-discriminating means and the output of its heterodyning means, and control-means connecting the respective gate-circuit means in each section to the output of the frequency-discriminating means in each of the respective higher-order sections, with said gate-circuit means in any section passing its received heterodyning means only when the discriminating means in all higher-order sections provide an output below a given threshold magnitude, regulator means for finely adjusting the frequency of said variable oscillator in response to the outputs of said frequency-discriminating means, and said regulator means being sequentially controlled by said discriminating means according to the decreasing order of said sections.

11. A stabilized-variable oscillator as in claim 10 including means for phase-locking the frequency of said variable oscillator with a given harmonic of one of said reference frequencies, comprising a last frequency-comparing section including frequency and phase-comparing means, said last section receiving one of said reference frequencies that has a lower order than any reference frequency received by said other sections, means for generating required harmonics from said last-mentioned reference frequency, last means for heterodyning a selected one of said last-mentioned harmonics and the output of the heterodyning means in the penultimate section, said frequency and phase-comparing means of said last section having one input connected to one of said reference frequencies, gate-circuit means in said last section connected in series between the other input to said frequency and phase-comparing means, and the output of the last heterodyning means, and control means for said last gate-circuit means connected to the output of the frequency-discriminating means in all said prior sections to pass the last heterodyned output to said frequency and phase-comparing means only when the output from the frequency-discriminating means in each prior section is below a given threshold magnitude.

12. A system as in claim 11 including means for tuning and indicating the output frequency of said stabilized variable oscillator, comprising first tuning-and-indicating means for simultaneously tuning said variable oscillator and said harmonic-generating-and-selecting means in said first-order frequency-comparing section, with said first tuning-and-indicating means providing an indication to the same order of magnitude as is provided by the reference frequency of said first-order frequency-comparing section, a plurality of other tuning-and-indicating means, each simultaneously tuning the harmonic generating-and-selecting means in a respective one of said frequency-comparing sections and the frequency-discriminator means in the adjacent higher-order section, with each tuning-and-indicating means providing a frequency indication to the same order of magnitude as is provided by the reference frequency of the respective section having the harmonic generating-and-selecting means which is tuned by the respective tuning-and-indicating means.

13. Means for stabilizing a variable oscillator with a more stable-frequency source in a decade manner, comprising means for providing a plurality of reference frequencies from said stable-frequency source, with said reference frequencies being consecutive integral powers of ten; a highest-order frequency-comparing section including first spectrum-generating means for generating a spectrum of harmonics from the highest of said reference frequencies, first tuned-circuit means for selecting a required harmonic from said spectrum-generating means output, first mixing means for heterodyning the output of said variable oscillator with the selected harmonic from said spectrum-generating means, and first tunable-frequency-discriminator means having its input connected in series with the output of said first heterodyning means to provide a direct-current output; a plurality of other frequency-comparing sections, with each of said other sections receiving a different and consecutively lower-order one of said reference frequencies, and each of said other sections being assigned the same order of magnitude as its reference frequency; each of said other sections also including a spectrum-generating means for generating a spectrum of harmonics from its assigned-reference frequency, a tuned-circuit means being connected to the output of said last-mentioned spectrum generating means to select a given harmonic, a means for heterodyning said selected harmonic and the output of the prior heterodyning means in the adjacent higher-order section, a frequency-discriminator means tunable over a frequency range that has an order of magnitude which is the same as the assigned reference frequency of its respective section, a gate-circuit means connected in series between the input to the respective tunable-discriminator means and the output of the respective heterodyning means in each of said other sections, and control means associated with said gate-circuit means being connected to the output of the discriminator means in each of the higher-order sections, a plurality of different order tuning-and-indicating means with each associated with a different one of said sections, the highest-order tuning-and-indicating means providing tuning for said variable oscillator and the tuned-circuit means in said highest-order section, each of said other tuning-and-indicating means providing simultaneous tuning for the tuned-circuit means in the section having the same order of magnitude as said tuning-and-indicating means and for the discriminator means in the adjacent higher-order section, with each of said tuning-and-indicating means providing an indication in the basic digits of the decade system with an order corresponding to the order of its respective section, said indicating means cumulatively indicating the stabilized frequency of said variable oscillator.

14. Means for stabilizing a variable oscillator by means of a more stable frequency source, comprising means associated with said stable source for providing first and second reference frequencies that are consecutive integer powers of ten cycles per unit-of-time, with said first reference frequency being the higher frequency, regulator means for finely adjusting the frequency of said variable oscillator, first and second frequency-comparing sections having their outputs connected to said regulator means to control the frequency adjustment of said variable oscillator; said first section including a first spectrum-generating means for receiving said first reference frequency and providing an output harmonic spectrum, a first-tuned circuit connected to the output of said first-spectrum generating means, a first mixer having one input connected to the output of said first-tuned circuit and another input connected to the output of said variable oscillator, a first fixed-tuned amplifier connected to the output of said mixer to pass the mixer's first-order difference frequency output, and a first discriminator tunable between two adjacent harmonics of said first spectrum-generating means; and said second frequency-comparing section including a second spectrum-generating means for receiving said second reference frequency and providing a spectrum of output harmonics, a second tuned-circuit connected to the output of said second spectrum-generating means, a second mixer having one input connected to the output of said second-tuned circuit and having a second input connected to the output of said first fixed-tuned amplifier, a second fixed-tuned amplifier connected to the output of said second mixer and passing its first-order difference heterodyned frequency, a gate circuit connected to the output of said second fixed-tuned amplifier, a second discriminator tunable between two adjacent harmonics of said second spectrum generating means, with the input of said second discriminator connected to the output of said gate circuit, control means for said gate circuit connected to the output of said first discriminator to permit said gate circuit to pass the output from said second mixer to said second discriminator when the output of said first discriminator is below a given threshold magnitude; and isolation means connecting the outputs of said first and second discriminator to said regulator means.

15. A system as defined by claim 14 including a first tuning means for simultaneously tuning said variable oscillator and said first tuned circuit in increments for respectively utilizing the harmonics from said first spectrum-generating means, second tuning means for simultaneously tuning said second tuned circuit and said first discriminator in increments for respectively utilizing harmonics from said second spectrum-generating means, and third tuning means for tuning said second discriminator.

16. A stabilized-variable oscillator as in claim 15 including a first indicating means associated with said first tuning means for indicating the frequency setting of said variable oscillator in a decade manner to its highest variable order of magnitude, second indicating means associated with said second tuning means for indicating the frequency setting of said second tuning means in a decade manner to the order of magnitude determined by the frequency spacing between two adjacent harmonics from said first generating means, third indicating means associated with said third tuning means for indicating the frequency setting of said second discriminator in a decade manner to the order of magnitude determined by the frequency spacing between two adjacent harmonics from said second generating means, and the frequency of said variable oscillator being the sum of the respective indications of said indicating means.

17. Means for providing phase-locked stabilization of a variable oscillator with respect to a crystal-controlled reference frequency source, comprising means for providing reference frequencies from said source which are 100-kilocycles-per-second, 10-kilocycles-per-second, and one-kilocycle-per-second, regulator means connected to said variable oscillator to adjust its frequency in response to the input of said regulator means, a first spectrum generator means for receiving said 100 kilocycle reference frequency and providing a spectrum of harmonics, a first-tunable circuit connected to the output of said first spectrum-generator means to select one of its output harmonics, a first mixer having one input connected to the output of said first tunable circuit, with its other input connected to the output of said variable oscillator, a first fixed-tuned amplifier having its input connected to the output of said first mixer to pass its first-order mixer difference component, and a first discriminator tunable between any two adjacent harmonics of said first spectrum generator and having its input connected to the output of said first fixed-tuned amplifier; a second order frequency-comparing section including a second-spectrum generator means for receiving said ten-kilocycle reference frequency and providing a spectrum of harmonics, a second-tunable circuit connected to the output of said second-spectrum generator means to select one of its output harmonics, a second mixer having one input connected to the output of said second-tunable circuit, with its other input connected to the output of said first fixed-tuned amplifier, a first gate circuit connected serially to the output of said second mixer, a second fixed-tuned amplifier having its input connected to the output of said gate circuit to pass the first-order mixer difference component, the control input of said gate circuit connected to the output of said first discriminator to open said gate circuit only when the output of said first discriminator is below a given threshold magnitude, and a second discriminator having its input connected to the output of said second fixed-tuned amplifier; a third frequency-comparing section including a third spectrum-generator means for receiving said one-kilocycle reference frequency and providing a spectrum of harmonics, a third-tunable circuit connected to the output of said third spectrum-generator means to select one of its output harmonics, a third mixer having one input connected to said third tunable circuit, with its other input connected to the output of said second fixed-tuned amplifier, second and third gating circuits connected in series with the output of said third mixer, control inputs of said second and third gating circuits connected respectively to the outputs of said first and second discriminators to open both of said gate circuits only when the outputs of each of said first and second discriminators are below a given threshold magnitude, a third fixed-tuned amplifier connected in series with the outputs of said gate circuits, and frequency-and-phase discriminator means having one input connected to the output of said third fixed-tuned amplifier, with its other input connected to said ten-kilocycle source; and isolation means connecting the outputs of said discriminators to said regulator means input.

18. A decade system as defined by claim 17 having a plurality of tuning means, with the first-tuning means providing simultaneous tuning for said variable oscillator and said first-tunable circuit in frequency increments determined by the frequency spacing between adjacent harmonics from said first-spectrum generator means, second-tuning means for providing tuning of said second-tunable circuit and said first discriminator in frequency steps determined by the spacing between adjacent harmonics from said second-spectrum generator means, and third-tuning means for tuning said third-tunable circuit and said second discriminator in increments determined by the spacing between adjacent harmonics from said third-spectrum generator means.

19. A stabilized-variable oscillator system as defined by claim 18 having decade indication, including first indicating means for indicating the tuned frequency of said variable oscillator to the first variable order of magnitude provided by said first tuning means, second indicating means for indicating the next decade order of magnitude which is associated with said second-tuning means, and third indicating means for indicating the last decade order of magnitude which is associated with said third-tuning means.

No references cited.

UNITED STATES PATENT OFFICE

Certificate of Correction

Patent No. 2,810,832 October 22, 1957

Samuel L. Broadhead, Jr.

It is hereby certified that error appears in the printed specification of the above numbered patent requiring correction and that the said Letters Patent should read as corrected below.

Column 5, line 57, for "initial oscillator" read —initial variable oscillator—; column 8, line 26, for $$f_{a_{H_2}} \quad \text{read} \quad f_{a_{H_2}}-\Delta f_2$$

column 15, line 21, for "kilocycles-per-necond" read —kilocycles-per-second—.

Signed and sealed this 11th day of March 1958.

[SEAL]

Attest:

KARL H. AXLINE,
*Attesting Officer.*

ROBERT C. WATSON,
*Commissioner of Patents.*